(12) United States Patent
Wurzer

(10) Patent No.: US 6,613,624 B2
(45) Date of Patent: Sep. 2, 2003

(54) METHOD FOR FABRICATING AN INTEGRATED SEMICONDUCTOR CIRCUIT

(75) Inventor: Helmut Wurzer, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/207,427

(22) Filed: Jul. 24, 2002

(65) Prior Publication Data

US 2003/0113963 A1 Jun. 19, 2003

(30) Foreign Application Priority Data

Jul. 24, 2001 (DE) .......................... 101 35 870

(51) Int. Cl.$^7$ .......................... H01L 21/8238
(52) U.S. Cl. .................. 438/200; 438/199; 438/275; 438/301; 438/229; 438/238
(58) Field of Search .................. 438/199, 200, 438/275, 279, 301, 303, 305, 225, 230, 231, 238

(56) References Cited

U.S. PATENT DOCUMENTS

| | | | |
|---|---|---|---|
| 6,060,349 A | * | 5/2000 | Peng et al. ................ 438/239 |
| 6,072,210 A | * | 6/2000 | Choi .......................... 438/253 |
| 6,087,225 A | | 7/2000 | Bronner et al. |
| 6,133,130 A | * | 10/2000 | Lin et al. ..................... 438/275 |
| 6,168,984 B1 | * | 1/2001 | Yoo et al. .................... 438/239 |
| 6,177,340 B1 | * | 1/2001 | Yoo et al. .................... 438/637 |
| 6,261,894 B1 | | 7/2001 | Mandelman et al. |
| 6,440,793 B1 | * | 8/2002 | Divakaruni et al. ........ 438/243 |

FOREIGN PATENT DOCUMENTS

| | | |
|---|---|---|
| JP | 2000 357 749 A | 12/2000 |
| WO | WO 01/15221 A1 | 3/2001 |

* cited by examiner

*Primary Examiner*—Kevin M. Picardat
(74) *Attorney, Agent, or Firm*—Laurence A. Greenberg; Werner H. Stemer; Ralph E. Locher

(57) ABSTRACT

Integrated semiconductor circuits have MOS transistors whose gate electrodes are provided with dopings in order to set the electrical potential of the channel region by an altered work function of the electrons. Transistors in semiconductor circuits having both a memory region and a logic region are fabricated either with different dopings for pMOS and nMOS transistors in the logic region (dual work function) or with a common source/drain electrode in the memory region (borderless contact). In the latter case, all the transistors of the semiconductor circuit receive the same gate doping. A method is proposed by which it is possible to realize dual work function and borderless contact on a semiconductor substrate simultaneously in a simple manner.

18 Claims, 5 Drawing Sheets

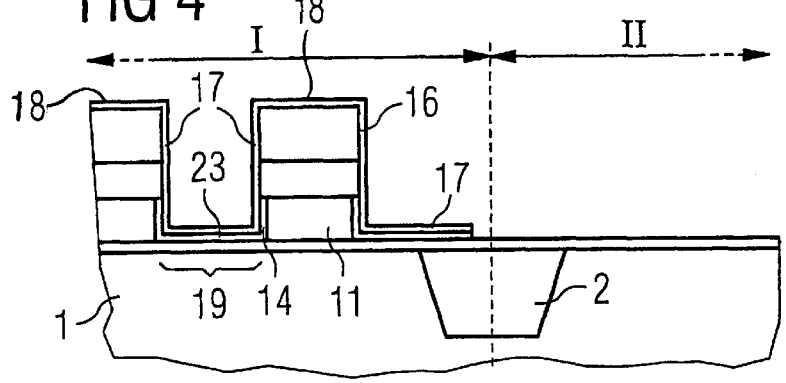
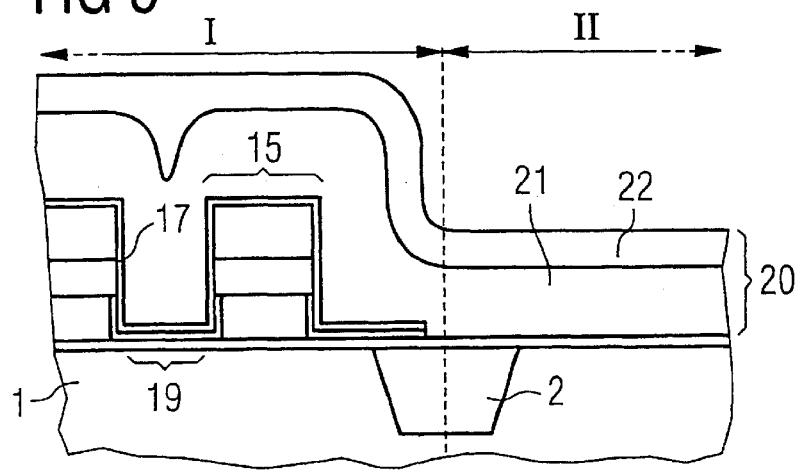
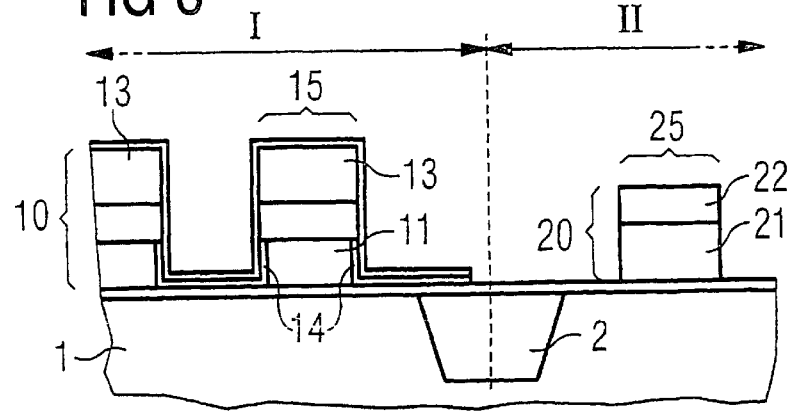

METHOD FOR FABRICATING AN INTEGRATED SEMICONDUCTOR CIRCUIT

BACKGROUND OF THE INVENTION

Field of the Invention

The invention relates to a method for fabricating an integrated semiconductor circuit.

To ensure proper fabrication to integrated semiconductor circuits, transistors are formed on a semiconductor substrate. Customary transistors are usually MOSFETs (metal oxide semiconductor field-effect transistors) whose central electrode, the gate electrode, is patterned from a sequence of layers deposited on a substrate. The source and drain electrodes are then implanted into the substrate on both sides of the gate electrode. The gate electrode substantially determines the switching behavior of the transistor. The desired switching behavior depends on the task accorded to the transistor. In particular, the circumstance of whether the transistor is a memory transistor of a memory cell or a logic transistor that must satisfy more stringent requirements made of the transistor performance and, under certain circumstances, also process analog signals greatly affects the construction of the transistor, in particular the composition of its gate layer stack.

Adjacent transistors on the substrate surface are usually disposed spatially separate and therefore each has an individual source terminal and a drain terminal. By contrast, transistors for memory cells can be fabricated in pairs at a short distance from one another, their adjacent gate layer stacks being separated only by a narrow region which simultaneously serves as source or drain contact for both transistors. The electrode terminal for the connection of the common electrode is subsequently introduced into the small interspace between the adjacent gate layer stacks. To that end, an etching is preformed in order to be able to electrically contact-connect the common electrode between the adjacent gate layer stacks. During this etching, the gate layer stacks themselves are attacked, which is undesirable. For this reason, the gate layer stacks are protected by a thick nitride layer that is deposited as topmost layer before their actual patterning. During the later etching for contact-connecting the substrate implantations, the nitride layer protects the gate layer stacks overall.

Transistors fabricated in this way can be disposed at a short distance from one another in the regions of the substrate surface that are memory regions, and be provided with a common source or drain terminal, which is referred to as a borderless contact. It is used exclusively in the memory region, where there are less stringent requirements made of the switching behavior of the transistors than in the logic region. Although the same transistors are produced in both regions, they are produced at a small distance from one another in pairs in the memory region, as a result of which, the substrate surface required for a memory cell is reduced. This makes it possible to fabricate particularly small memory cells.

In order to improve the switching behavior of a transistor, it is customary nowadays for the bottommost layers of a gate layer stack to be doped by an ion implantation. Although, unlike in the source and drain electrodes, which are only formed by the introduction of implantations into the substrate, an implantation of the gate electrode is not absolutely necessary since the gate electrode only serves for the generation of an electric field through the gate oxide layer, the electrical potential of the substrate channel region situated beneath the gate layer stack can be optimized if the electrical potential of the gate layer situated above it is altered. In accordance with the band scheme for electronic systems in solids, such a potential shift is effected with the aid of introduced dopings that cause an energetic band shift in the gate electrode. This band shift leads to an alteration of the work function of the electrons in the bottommost gate layer at the boundary with the underlying gate oxide. The electrical potential of the channel region is altered through this altered work function.

The band shift required has a different magnitude depending on the type of transistor. In particular, it may be positive or negative.

N-channel transistors, whose channel is formed by negative charge carriers are provided with an n-type doping of the gate electrode. P-channel transistors, by contrast, receive a p-type doping. In cMOS circuits (complementary MOS), a different doping of n-channel and p-channel transistors is optimal.

Difficulties arise as soon as an integrated semiconductor circuit contains both memory transistors and logic transistors. Many of today's integrated circuits, for example ASICs (application specific integrated circuits), contain memory regions that are surrounded by logic regions and are referred to as embedded DRAMs (embedded dynamic random access memories). Both regions are fabricated by the same fabrication method. In particular, the transistors for both regions are produced by a common method process.

In the memory region, where the memory transistors are to be produced as far as possible in a borderless contact construction, i.e. in pairs with a common electrode between the gate layer stacks, the gate electrode must be protected by a protective layer, typically having a thickness of 200 nm, against the contact hole etching which is required for fabricating a borderless contact. On account of this thick protective layer, implantations cannot subsequently be implanted into the gate electrode. Therefore, doped polysilicon is deposited as bottommost gate layer, e.g. as PSG. As a result, the transistors to be produced in the memory region can be produced in pairs with a borderless contact.

This construction of integrated circuits has the disadvantage in the logic region. The transistors of the logic region are produced at the same time as the transistors of the memory region. In the logic region, the same gate implantation is introduced in all the logic transistors, both in the n-channel transistors and in the p-channel transistors. The gate implantation is coordinated with the memory transistors (usually exclusively n-channel transistors), which are disposed in the memory region. The p-channel transistors that are likewise disposed in the logic region thus receive a negative doping in their gate electrodes, which sets a non-optimal work function of the electrons in their gate layer. The same value of the work function is set between the lower gate layer and the gate oxide in all the transistors of the integrated semiconductor circuit. This construction is referred to as single work function.

This construction is disadvantageous, however, in the logic region.

Particularly in the case of transistors of increasingly smaller dimensioning with a lower operating voltage, the respective optimal adaptation of the work function and thus the dual work function construction become increasingly important.

If, on the other hand, the transistors of the integrated semiconductor circuit are to be produced in a dual work function construction, then two different dopings must be introduced into the bottommost gate layer. The dopings can only be introduced subsequently by implantation. Since these implantations are implanted at the same time as the source/drain dopings, p-channel transistors receive a positive gate doping and n-channel transistors receive a negative gate doping. Two implantation steps are carried out, during which the respective transistors that are not to be implanted are covered by a mask.

The subsequent implantation in the logic region precludes deposition of a predoped gate layer and thus requires a subsequent implantation of the gate electrodes in the memory region as well. However, this means that a close pairwise configuration of transistors with a borderless contact is not possible in the memory region since the thick protective layer over the gate electrodes that is required for the contact hole etching prevents a subsequent implantation. Consequently, the construction of an integrated semiconductor circuit with dual work function, i.e. with two kinds of values of the work function of the electrons from the respective gate, has the effect that the transistors in the memory region cannot be produced in a borderless contact construction, i.e. with a common source-gate electrode, but rather must be disposed spatially separate form one another, so that each memory cell requires a significantly larger substrate area.

To date, it has been possible to combine dual work function and borderless contact with one another only with difficulty. Semiconductor circuits having both a memory region and a logic region are conventionally fabricated according to only one of these alternatives. For the most part, in view of the required storage capacity, the construction with a borderless contact but with a single work function is preferred, i.e. the gate electrodes of the p-channel transistors (contained exclusively in the logic region) also receive the n-type doping that is unfavorable for them. It would be desirable to be able to fabricate transistors both in a borderless contact construction and in a dual work function construction on a single semiconductor substrate.

SUMMARY OF THE INVENTION

It is accordingly an object of the invention to provide a method for fabricating an integrated semiconductor circuit that overcomes the hereinafore-mentioned disadvantages of the heretofore-known devices of this general type and that fabricates semiconductor circuits with transistors that are configured, in the memory region, as transistor pairs in a borderless contact construction and, in a logic region, in a dual work function construction, i.e. with in each case different gate dopings for transistors of different conduction types. Borderless contact and dual work function are to be realized together on a single semiconductor substrate.

This object is achieved according to the invention by a method for fabricating an integrated semiconductor circuit. The method has the following order of steps:

a) deposition of a first layer sequence, the bottommost layer of which is composed of an oxidizable material, onto a semiconductor substrate, b) anisotropic etching of the first layer sequence, as a result of which the latter is patterned to form first gate structures in a first area region of the semiconductor substrate and is removed again in a second area region of the semiconductor substrate, c) oxidation of the bottommost layer of the first layer sequence at sidewalls of the first gate structures in the first area region, d) deposition of a second layer sequence onto the semiconductor substrate, as a result of which the first gate structures are covered in the first area region, e) performance of an anisotropic etching of the second layer sequence, as a result of which the latter is patterned to form second gate structures in the second area region and is removed again from the first gate structures in the first area region, the semiconductor substrate being processed in such a way that, prior to the deposition of the second layer sequence (step d), in the first area region, at least the top sides of the first gate structures and surfaces of the semiconductor substrate that are parallel to them between the first gate structures are covered with an etching stop layer, by which (in step e), the anisotropic etching is ended in the first area region.

The invention provides a method by which the gate structures of a first area region—a memory region—and the gate structures of a second area region—a logic region—are fabricated one after the other. The gate structures fabricated in these area regions can include different gate layer sequences. Although each layer sequence and also each individual layer is deposited over both area regions of a semiconductor substrate, the method according to the invention leads to the formation of two different gate layer sequences on different area regions.

According to the invention, firstly a first layer sequence is deposited onto a semiconductor substrate. Because a layer sequence for a gate structure is involved, the semiconductor substrate is already provided with a gate oxide layer at this point in time. The first layer sequence is preferably intended for transistors in a memory region. The bottommost layer of the first layer sequence is composed of an oxidizable material. An anisotropic etching of the first layer sequence is subsequently carried out, as a result of which the latter is patterned. The patterning is done with the aid of a mask that covers those regions of the layer sequence that are not to be etched, i.e. removed. The first layer sequence is patterned to form first gate structures in a first area region, in which memory transistors are to be fabricated. In a second area region, the first layer sequence is completely removed again from the semiconductor substrate. Consequently, first gate structures only remain in the first area region. The sequence of the individual layers of the first layer sequence is visible at the sidewalls of the structures; each individual layer is accessible there from the side.

The bottommost layer is subsequently oxidized at the sidewalls of the first gate structures. Since gate structures are fabricated with the aid of the first layer sequence, a gate electrode, in particular the bottommost layer thereof, must be free of impurity ions. Impurity ions can pass into the bottommost gate layer for instance during the gate patterning. In order to spatially bind such ions, the bottommost gate layer, composed of an oxidizable material, is oxidized at the sidewalls of the first gate structures, as a result of which any impurity ions are enclosed and bound in the region of the sidewall and can therefore no longer diffuse in the gate electrode. This concludes the production of the first gate structures in the first area region.

In order to produce further gate structures with a different layer construction in the remaining area region of the semiconductor substrate, a second layer sequence is deposited onto the semiconductor substrate, as a result of which the first gate structures are covered in the first area region. The consequence of the first gate structures being covered is that, for the time being, the structures are no longer accessible and for the time being interspaces between adjacent gate structures are also no longer accessible for implantations.

Finally, an anisotropic etching of the second layer sequence is carried out, as a result of which the latter is patterned to form second gate structures in the second area region and is removed again from the gate structures in the first area region. During the removal of the second layer sequence from the first gate structures—formed from the first layer sequence—in the first area region, it must be ensured that the first gate structures that were produced first are not damaged by the (second) anisotropic etching. This is ensured according to the invention by virtue of the fact that, at a suitable point in time, but in any event prior to the deposition of the second layer sequence, an etching stop layer is deposited onto the first area region and the etching process for etching the second layer sequence is carried out selectively with respect to the etching stop layer. On account of the selective etching process, the etching stop layer is hardly attacked in the first area region and thereby protects the first gate structures during the etching of the second layer sequence.

According to the invention, the semiconductor substrate is processed in such a way that the top sides of the first gate structures and surfaces of the semiconductor substrate that are parallel to them between the first gate structures are covered with an etching stop layer. The top sides of the gate structures and the surfaces between the gate structures can be covered by one and the same etching stop layer or else by different etching stop layers. In any event, however, both the top sides of the gate structures and the surfaces parallel to them between the gate structures must be covered since the etching in step e) acts on both surfaces. In this case, use is made of the fact that the etching process for the patterning of the second layer sequence is an anisotropic etching process that effects etching principally perpendicularly to the substrate surface and whose lateral etching rate is negligible in comparison with that perpendicularly to the substrate surface. A suitable choice of the processing of the semiconductor substrate before the deposition of the second layer sequence ensures that an etching stop layer is formed at least on all surfaces that run parallel to the top side of the semiconductor substrate that is to be patterned.

The etching stop layer is not necessarily present on the sidewalls of the first gate structures. However, the oxide of the bottommost layer of the first layer sequence is situated there, the oxide protecting the sidewall against the anisotropic etching. The protection solely by the sidewall oxide of the bottommost gate layer is sufficient because the etching rate of the anisotropic etching process in the lateral direction is small in relation to the etching rate in the vertical direction. At the sidewalls of the first gate structures, protection is effected at least in the region of the bottommost gate layer since there the oxide on the sidewall must be consumed by the etching process before the bottommost gate layer itself is attacked.

The etching stop layer must in any event be deposited before the second layer sequence. The time at which the etching stop layer is deposited is chosen according to the invention such that after this deposition or, if the first gate structures are then as yet not patterned, when the first layer sequence is patterned, at least the top sides of the first gate structures have the etching stop layer.

Instead of deposition of the etching stop layer, a different way of applying the etching stop layer is also conceivable, for instance by converting a layer present on the substrate surface.

In a first type of embodiment of the invention, it is provided that in step a) a first etching stop layer which covers the top sides of the first gate structures is deposited as topmost layer of the first layer sequence, and in that, in step c), an oxide layer is produced as further etching stop layer on the surfaces of the semiconductor substrate that are parallel to the top sides between the first gate structures.

In this case, the construction of the first layer sequence itself ensures that the etching of the second layer sequence does not attack the first layer sequence. The etching process for removing the second layer sequence is formed using etchants that are coordinated with the respective layers of the second layer sequence and act in temporal succession one after the other on the semiconductor substrate. Because the second layer sequence is deposited conformally, all that is required for a selective etching process is that the bottommost layer of the second layer sequence is composed of a different material than the topmost layer of the first layer sequence, i.e. the etching stop layer. Therefore, for the etching stop layer, a material is chosen that is resistant to an etchant for etching the bottommost layer of the second layer sequence.

In accordance with this type of embodiment, the etching stop layer is not deposited directly before the application of the second layer sequence, but rather already in step a) during the deposition of the first layer sequence. The consequence of this is that, because of the subsequent patterning of the first layer sequence, the first gate structures thereby formed are only protected toward the top by the etching stop layer. On account of the anisotropy of the second etching operation for removing the second layer sequence, this protection suffices because the sidewalls of the gate structures are already protected by the oxide of the bottommost gate layer.

Furthermore, in this type of embodiment, in step c), an oxide layer is produced as further etching stop layer between the first gate structures. This further etching stop layer, an oxide layer, is produced at the same time as the sidewall oxide produced in step c) and, in the same way as the first etching stop layer, protects the semiconductor structure already fabricated in the first area region when the second layer sequence deposited above that is removed again in step e). To that end, the etching in step e) must be carried out selectively both with respect to the first and with respect to the second etching stop layer by using suitable etchants and layer materials. By way of example, polysilicon can be etched selectively with respect to nitrides and also oxides.

In an alternative, preferred type of embodiment, it is provided that between steps c) and d), an additional layer is deposited as etching stop layer onto the first area region.

In this case, the etching stop layer is deposited shortly before the application of the second layer sequence. The etching stop layer is deposited firstly over the entire semiconductor substrate, i.e. in the first and second area regions. In the second area region, the etching stop layer is subsequently removed by etching, during which a mask layer protects the first area region. Afterward, the mask layer is removed to uncover the etching stop layer that is now only present in the first area region. The deposition is preferably a conformal deposition.

This second type of embodiment has the advantage that the etching stop layer is formed not only on the top side of the first gate structures but also on the sidewalls thereof and, moreover, also on the semiconductor substrate between the first gate structures in the first area region. As a result, the first area region of the substrate surface including the first gate structures produced is completely protected against the second anisotropic etching.

Preferred types of embodiment provide for an etching stop layer made of a nitride, preferably made of silicon nitride, or an etching stop layer made of a metal oxide, preferably made of tungsten oxide or aluminum oxide, to be deposited.

Nitride layers are suitable, for example for etching processes which are carried out with the aid of hydrogen halides such as hydrogen chloride or hydrogen bromide, as etching stop layer during an etching of polysilicon or silicon. Furthermore, oxides can be etched selectively with respect to a nitride if $C_4F_8$ is used as etchant.

More recent etching stop layers made of metal oxides have an even far higher selectivity relative to conventional etchants and therefore need only be deposited very thin.

It is preferably provided that in step d), a second layer sequence is deposited whose bottommost layer is composed of an oxidizable material, and that (in another step) the bottommost layer of the second layer sequence is oxidized at sidewalls of the second gate structures in the second area region. Impurity ions that have already diffused into this layer are thereby bound. The thickness of the sidewall oxide of the second gate structures can turn out to be smaller than that of the first gate structures, i.e. the duration of the second oxidation can be chosen to be shorter, because the sidewall oxide of the gate structures in the second area region is no longer attacked by a subsequent etching.

After the formation of the sidewall oxide in the second area region, the etching stop layer can be removed in the first area region. In accordance with a preferred embodiment, an etching process is carried out that etches the etching stop layer selectively with respect to the oxidized material of the bottommost layer of the first layer sequence on the sidewalls of the first gate structures (i.e. selectively with respect to the sidewall oxide in the first area region) and selectively with respect to the sidewall oxide in the second area region. The selectivity of this etching-back of the etching stop layer has the advantage that the remaining sidewall oxides can be utilized in order to set a sufficient lateral distance between the implanted regions and the gate electrode during a later implantation of LDD regions and/or pocket regions. These implantations are introduced before the highly doped implantations for the source and drain electrodes are introduced.

The latter are introduced simultaneously into the gate electrodes in today's methods in order to achieve a suitable setting of the work function of the electrons from the gate electrode. In accordance with preferred embodiments, firstly a negative doping is introduced into the second gate structures in a first partial region of the second area region and a positive doping is introduced into the second gate structures in a second partial region of the second area region. The introduction of the negative doping and the positive doping into different partial regions of the logic region, which enables a logic region in a dual work function construction, is effected temporally successively in that firstly the second partial region is covered by a mask layer, while the first region is provided with the negative doping. Afterward, the mask layer is removed in the second partial region and the first partial region is covered by a further mask layer in order to introduce the positive dopant into the second partial region. Afterward, this mask layer is also removed again. Those transistors that are disposed in the first (second) partial region of the second area region are doped with the negative (positive) doping in the region of the source, drain and gate electrodes. As a result, there are formed in the logic region pMOS transistors and nMOS transistors whose gate electrodes have a negative or positive doping optimized for the respective work function of the electrodes, i.e. the cMOS circuit in the logic region is produced in a dual work function construction.

With regard to the doping of the gate electrodes in the first area region, the memory region, in a preferred type of embodiment it is provided that in step a), a doped, preferably n-doped, material is deposited as bottommost layer of the first layer sequence. Doping the bottommost gate layer of the memory region, i.e. the first layer sequence, as early as during the deposition process has the advantage that the doping does not have to be introduced subsequently. An implantation of the first layer sequence as early as during the deposition is advantageous in particular on account of the thick protective layer that is required for the borderless contact and prevents a subsequent implantation in the bottommost layer of the first layer sequence.

It is preferably provided that polysilicon is deposited in each case as bottommost layer of the first and the second layer sequence. Polysilicon is easily oxidizable, cost-effective and is used as bottommost gate layer in particular in gate structures including a plurality of layers. The low electrical conductivity of polysilicon is compensated by at least one further, overlying gate layer of higher conductivity. Typical materials for a further gate layer are, for example, tungsten or tungsten-containing metal alloys. Besides polysilicon, germanium or a silicon-germanium layer can also be deposited.

Preferably, selection transistors for memory cells are fabricated in the first area region. Their gate electrodes are formed by layers of the first gate structures. The source/drain implantations of the transistors are situated laterally with respect to these gate structures. Logic transistors are preferably fabricated in the second area region.

In a preferred type of embodiment, it is provided that transistor pairs with a source/drain electrode implantation common to both transistors of a transistor pair are produced in the first area region. The selection transistors provided in the memory region are disposed in pairs at a short distance from one another and are provided with a common electrode implantation between the gate layer stacks. The distance between the transistors of a transistor pair is already defined by a corresponding mask during the patterning of the first layer sequence.

It is preferably provided that the common source/drain electrode implantation is contact-connected by a contact hole filling (borderless contact) extending to sidewall coverings (spacers) of the gate structures of both transistors of a transistor pair. The gate layer stacks of the selection transistors in the memory region are protected against the contact hole etching by a suitable first layer sequence having an upper protective layer of sufficient thickness. Since a second, other layer sequence, which does not have this thick protective layer can be fabricated in the logic region with the aid of the method according to the invention, the gate structures in the logic region can subsequently be doped, i.e. the logic circuit can be produced in a dual work function construction.

It is preferably provided that in step a), the first layer sequence is deposited onto a semiconductor substrate covered with a gate oxide layer.

Other features which are considered as characteristic for the invention are set forth in the appended claims.

Although the invention is illustrated and described herein as embodied in a method for fabricating an integrated semiconductor circuit, it is nevertheless not intended to be limited to the details shown, because various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 1 to 11 are sectional views showing an integrated semiconductor circuit in different stages of a method according to the invention.

DESCRIPTION OF THE PREFERRED EMBODIMENTS

Figure 1:
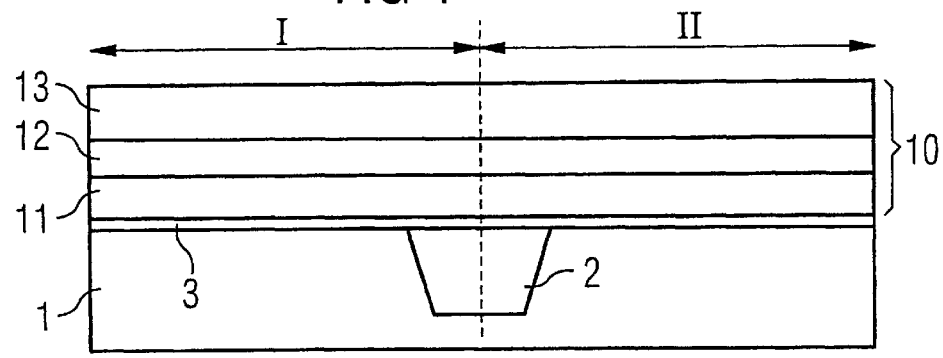

Referring now to the figures of the drawings in detail and first, particularly to FIG. 1 thereof, there is shown a first layer sequence 10 is deposited on a semiconductor substrate 1. The layer sequence 1 may be composed of a first, lower gate layer 11, a second gate layer 12 and a hard mask layer 13. The number, the composition and the thickness of the respective layers of the layer sequence 10 can be chosen as desired. Because gate structures are to be formed from the layer sequence 10, the semiconductor substrate 1 is provided with a gate oxide 3 before the deposition of the layers 11, 12 and 13. In order to delimit the memory region I from the logic region II, a shallow trench isolation 2 introduced into the semiconductor substrate 1 prior to the formation of the gate oxide layer 3 is illustrated, which is constructed in the same way as a trench isolation 2'—disposed within the logic region II—for the electrical insulation of adjacent transistors.

Figure 2:
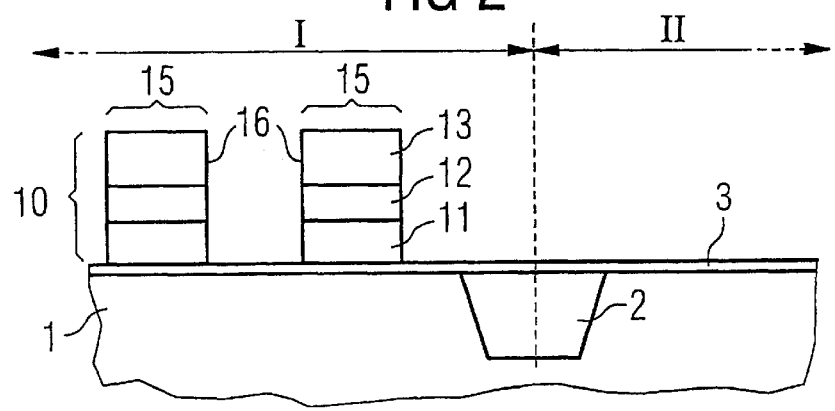
Figure 3:
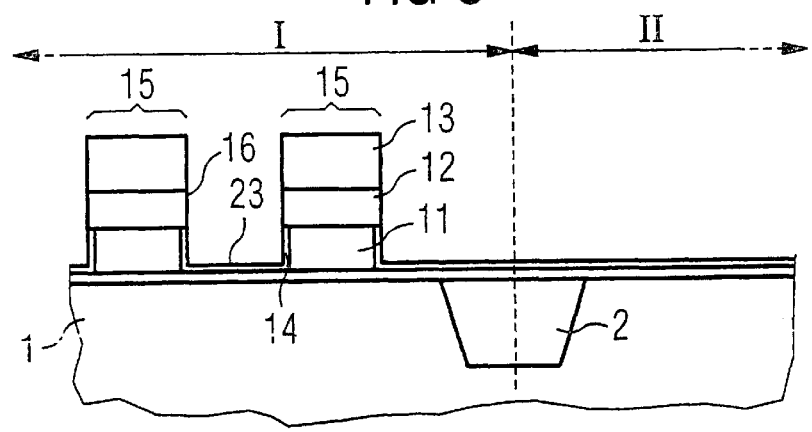

The layer sequence 10 illustrated in FIG. 1 is patterned by an anisotropic etching operation, as a result of which, the layer sequence 10 is completely removed in the area region II and first gate structures 15 remain in the area region I, as illustrated in FIG. 2. The layers 11, 12 and 13 deposited on top of one another are uncovered at the sidewalls 16 of the first gate structures 15. The bottommost layer 11 deposited first is typically a polysilicon layer that serves as bottommost gate layer; disposed above it is, typically, a layer of high electrical conductivity, for example a metal layer 12. Above that, there may be formed a hard mask layer 13 that is made particularly thick owing to the later contact hole etching for the introduction of a borderless contact. The bottommost layer 11 of the first layer sequence is subsequently oxidized, with the result that oxide layers 14 form on the layer 11 at the sidewalls 16, as illustrated in FIG. 3. As a result, in the lower region of the gate layer stacks 15, impurity ions that have passed into the bottommost gate layer 11 through the patterning of the gate layer stack 10 are enclosed and can no longer diffuse. At the same time as the formation of the sidewall oxide, the thickness of the gate oxide layer 3 also grows, substrate material being oxidized. The oxide layer 3 reinforced in this way can later be used for the selective etching of the etching stop layer.

If the sidewall oxide is formed in the first area region, a gate oxide can simultaneously be produced in the second area region. To that end, a screen oxide 3 previously still situated on the semiconductor substrate 1 is removed in the area region II. A new oxide that is free of any impurity ions and is thus better suited as gate oxide can now be grown on the now uncovered silicon surface.

After the formation of an oxide layer 14 on the side walls of the bottommost layer of the first gate structures 15, an etching stop layer 17 is deposited on the semiconductor substrate 1 and subsequently etched back in the second area region II. As illustrated in FIG. 4, the etching stop layer 17 remains only in the first area region I, where it covers the top sides 18 and the sidewalls 16 of the gate structures 15 and also the bottom of the semiconductor substrate 1 between the first gate structures.

A second layer sequence 20 for fabricating the second gate structures in the second area region II is then deposited onto this structure, as illustrated in FIG. 5. To that end, layers 21, 22 of the second layer sequence 20 are successively deposited onto the substrate, the first gate structures 15 in the first area region I being covered and enclosed by these layers.

In order to pattern the second layer sequence, it must be etched. In this case, the first gate structures 15 in the first area region I must not be damaged. The etching stop layer 17 serves to protect the first gate structures 15 during the etching of the second layer sequence 20. The material of the etching stop layer 17 is chosen such that it is resistant to the etchant for patterning the bottommost layer 21 of the second layer sequence 20. The etching stop layer 17 is preferably produced from a nitride or a metal oxide.

The patterning of the second layer sequence 20 produces the semiconductor structure illustrated in FIG. 6, on which second gate structures 25 are formed in the second area region II. The layer sequence 20 of the gate structures 25 differs from the layer sequence 10 of the first gate structures 15 in the first area region I. The second layer sequence 20 is composed of, for example, an undoped polysilicon layer 21 covered by a hard mask layer 22. In place of the lower layer 21, it is also possible to provide a plurality of gate layers lying one above the other in the logic region II.

The bottommost gate layer 21 of the second gate structures 25 is then oxidized at the sidewalls 26, as a result of which sidewall oxides 24 are formed in the second area region II. At the same time, the gate oxide present in the second area region II is reinforced between the gate structures 25.

Figure 7:
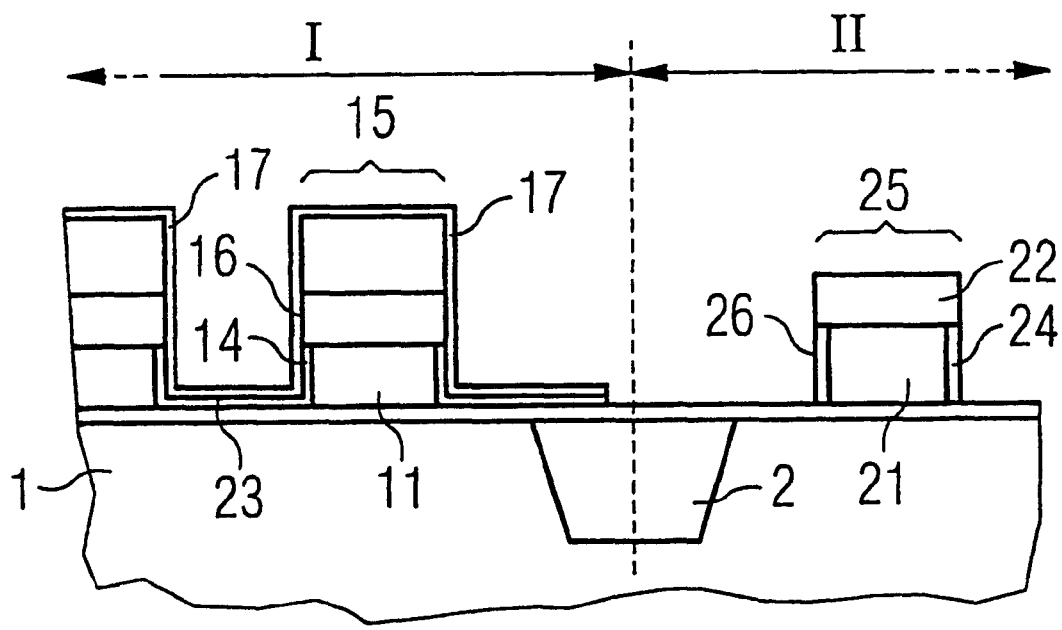

During the formation of the sidewall oxide in the area region II (FIG. 7), the etching stop layer 17 in the first area region I protects the first gate structures 15 against oxidation or further oxidation of the sidewalls 16. By contrast, the oxidation of the sidewalls 26 of the gate structures 25 in the second area region II can be carried out until the sidewall oxide 24 formed has the desired layer thickness. The latter may be set in a manner deviating from the layer thickness of the sidewall oxide 14 of the gate structures 15 in the first area region I. In the first area region I, by contrast, the etching stop layer 17 prevents the oxide layer 14 already formed from propagating from the sidewalls 16 of the gate structures 15 further into the bottommost gate layer 11 and making it more difficult to subsequently introduce LDD regions into the vicinity of the gate layer 11.

Figure 8:
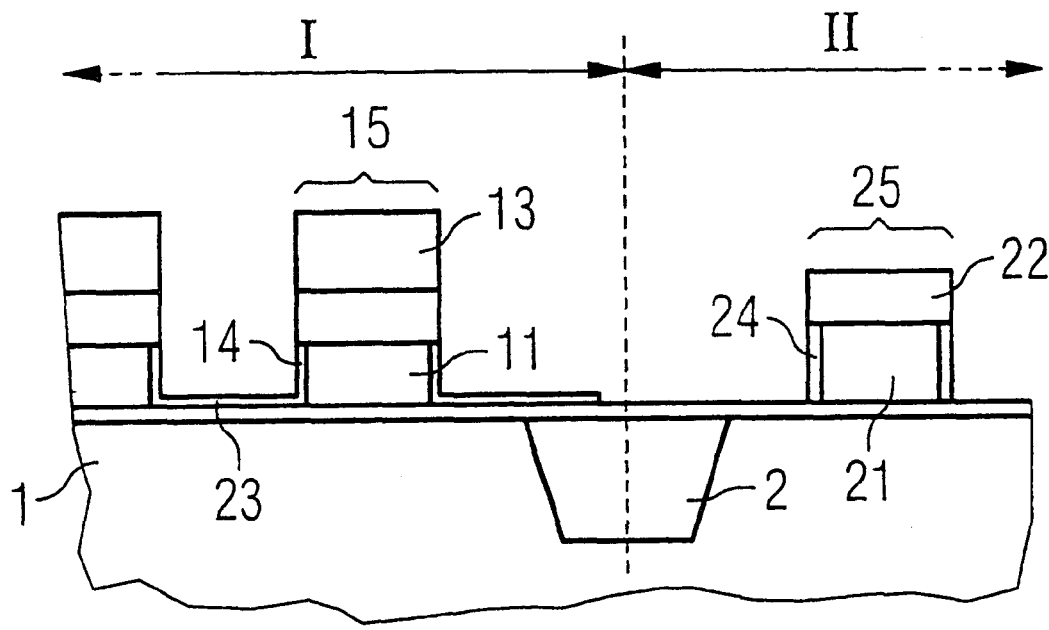

The etching stop layer 17 can then be removed by a selective etching process, thereby producing the semiconductor structure illustrated in FIG. 8. It has two different types of gate structures 15 and 25 in different area regions I, II. Both gate structures 15, 25 have oxide layers 14 and 24, respectively, at the sidewalls of the respective bottommost gate layer 11 and 21. Therefore, the etching stop layer 17 can be etched selectively with respect to this material without the first gate structures 15 being damaged. The etching stop layer 17 is etched for example by a highly selective $CF_4$ etching.

Figure 9:
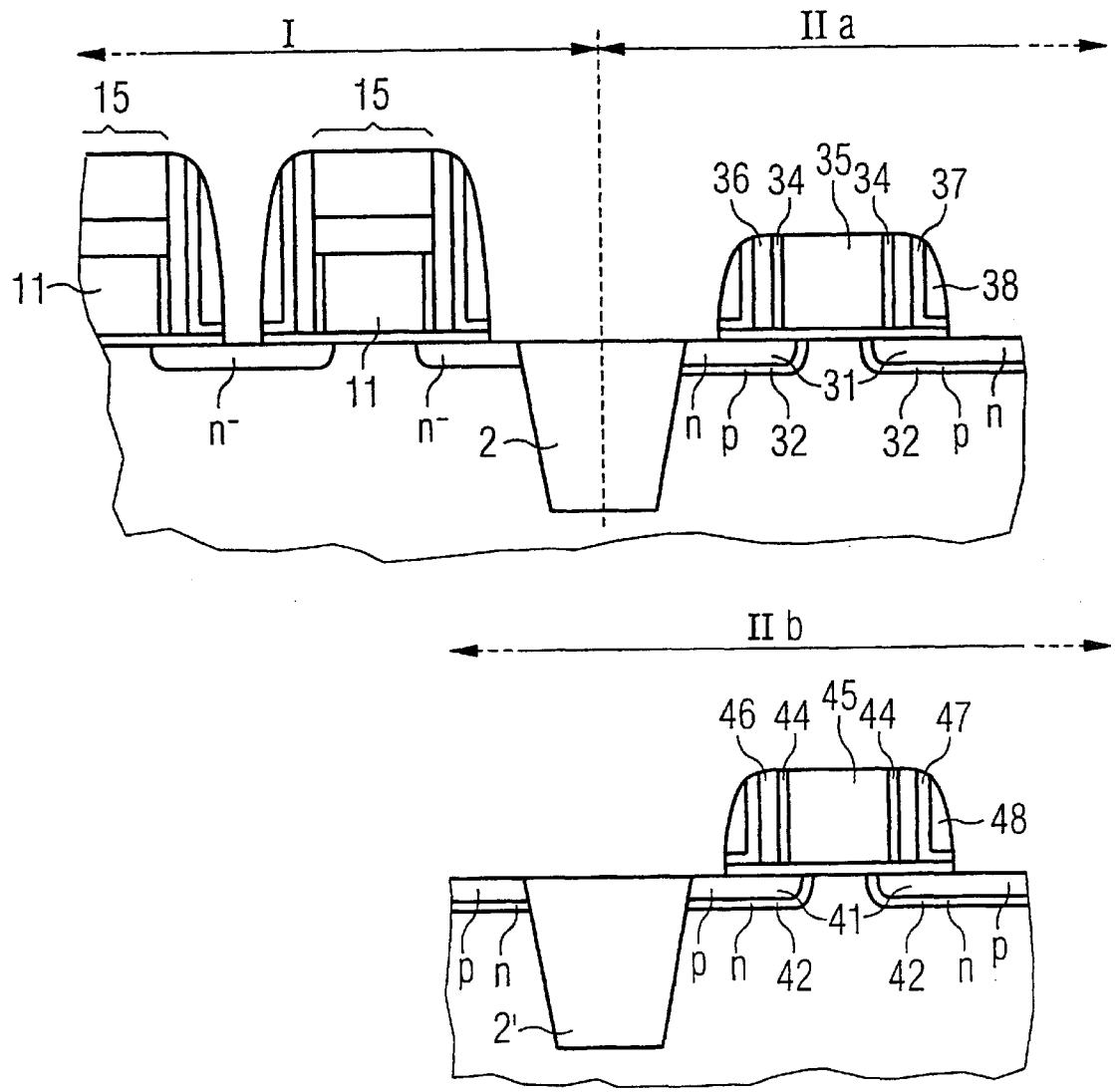

After the gate structures 15 and 25 have been completed and the etching stop layer 17 has been removed, the implantations for fabricating transistors can be introduced into the semiconductor substrate. FIG. 9 shows a semiconductor structure that already has weakly doped regions. The highly doped regions 39, 49 for completing source and drain electrodes are only illustrated in FIG. 10.

FIG. 9 illustrates, in the logic region II, two gate structures 35, 45, of which a first 35 is processed to form an nMOS transistor and a second 45 is processed to form a pMOS transistor. Both gate structures 35, 45 are covered by the sidewall oxide 34, 44 at their sidewalls. Situated laterally beside the oxide are further spacer layers that were applied successively for different dopings.

Firstly, implantations were introduced in a first partial region IIa of the second area region II in which nMOS transistors are to be fabricated. For this purpose, the first area region I (the memory region) and the other partial region IIb of the second area region II (the remaining logic region) were covered with a mask. Firstly, an n-type doping 31 was implanted in the partial region IIa of the logic region of the substrate surface at a point in time in which the gate structures 35 were only covered by the sidewall oxide 34, as a result of which LDD regions (lightly doped drain) were formed in the semiconductor substrate laterally beside the gate structures 35. Afterward, pocket regions or halo regions 32 were implanted into the substrate surface IIa intended for nMOS transistors. Halo regions and pocket regions surround LDD regions and are doped with ions of the opposite charge carrier type. A halo region is fabricated by an implantation directed perpendicularly to the substrate surface below the LDD regions, while a pocket implantation is implanted obliquely into the semiconductor substrate in order to introduce the doping more easily into the substrate region below the gate electrode 35. Afterward, the mask was removed and first spacers 36, 46 were deposited on the sidewall oxides 34, 44 by the semiconductor substrate being covered with a corresponding spacer layer over the whole area and the spacer layer then being etched back anisotropically to leave spacer layers 36, 46 only on the sidewalls. Afterward, a new mask was patterned in such a way as to cover the memory region I and the partial region IIa. In the region IIb of the pMOS transistors, LDD regions 41 and halo regions 42 were implanted through this mask, the additional spacer 46 compensating for the higher diffusion rate of the boron implantation.

Finally, in the area region IIa, wider second spacers formed from a conformal thin layer 37 and a larger filling 38 were formed and, with the aid of these spacers, the highly doped source/drain regions were implanted at a greater distance from the gate structures 35. The respective other area regions were temporarily masked for the introduction of the implantations for the nMOS and pMOS transistors.

In the region of the gate structure 45, the oxide layers on the sidewalls are designated by 44, the first spacers are designated by 46, and the two layers of the second spacers are designated by 47, 48. The LDD regions are p-doped in the case of the pMOS transistor; the halo regions 42, by contrast, are n-doped. The spacers in the region of the gate structure 45 have somewhat different lateral dimensions than the spacers in the region of the gate structure 35, in order to compensate the different diffusion rates of the ions of the opposite charge carrier type.

The channel doping, the anti-punch doping below the channel doping are not illustrated in FIG. 9; they were already introduced into the semiconductor substrate prior to the deposition of the second layer sequence. They run below the gate structures 35, 45 between the LDD and pocket implantations in FIG. 9.

In a similar manner to in the logic region II, in the memory region I, too, the first gate structures 15 are covered with spacers at their sidewalls. The source and drain regions that are disposed at a suitable lateral distance from the gate electrodes 11 with the aid of these spacers are only weakly doped, because the memory transistors to be formed must ensure a large retention capability of the information, i.e. charges, stored in the memory cells.

Figure 10:
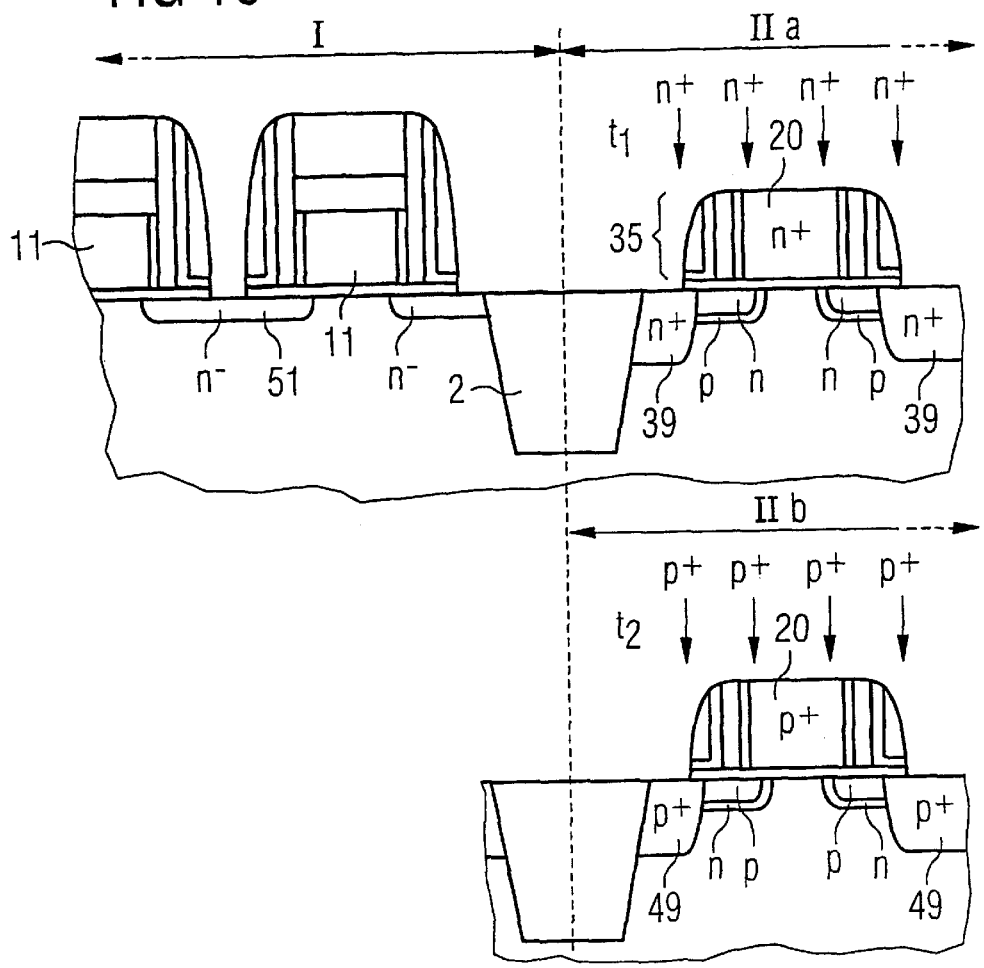
Figure 11:
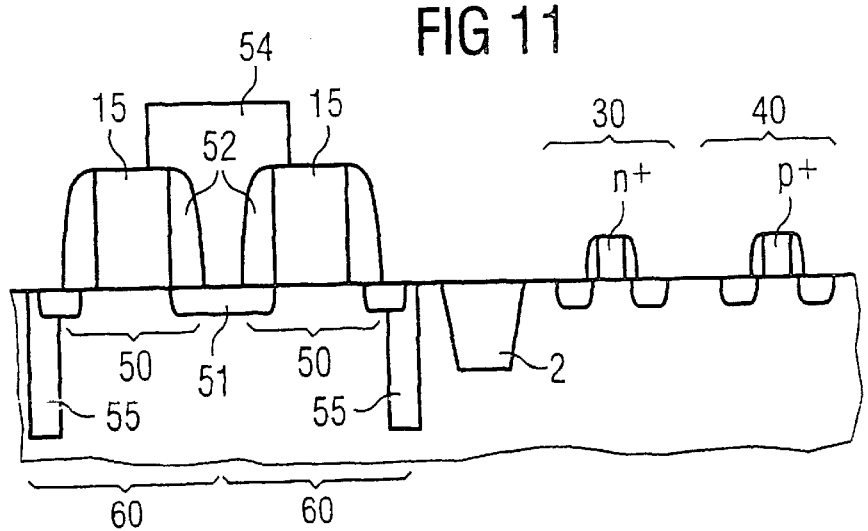

The gate dopings required for the dual work function construction of the logic transistors in the second area region II are only introduced together with the HDD implantations (highly doped drain) for the source/drain electrodes. FIG. 10 shows the semiconductor structure thereby obtained. At a first point in time $t_1$, in the area region IIa in which nMOS transistors are to be fabricated, negative charge carriers were introduced in a high concentration $n^+$ into the source/drain regions 39 and into the second layer sequence 20 of the gate structure 35, while the remaining area regions I, IIb were masked. By virtue of the fact that the gate layer stack 20, in particular its lower gate layer 21, is also doped during this implantation, a suitable value of the work function of the electrons is set in the lower gate layer 11 and the electrical potential of the channel region beneath the gate oxide is thus optimized.

Correspondingly, at a later point in time $t_2$, a p-type doping is implanted in a high concentration $p^+$ in the remaining logic region Iib. As a result, the source and drain electrodes 49 of the pMOS transistors are produced and a different value—more favorable for the pMOS transistors—of the work function of the electrons on the bottommost layer 11 of the layer sequence 20 is set there.

During the introduction of the HDD implantations, possible bipolar transistors or ESD structures, i.e. electrostatic diodes, can be produced at the same time. Finally, the highly doped active logic regions (source, gate and drain electrodes) are silicided in order to reduce the contact resistance of the Schottky contacts produced by the contact connection, for which purpose the memory region and possible ESD structures are covered with a thin hard mask. After the application of a titanium or cobalt layer, a titanium silicide or a cobalt-silicide layer is formed at the contact areas through a momentary great increase in temperature (rapid thermal anneal). After the siliciding, a leveling covering layer is applied.

If the transistors in the logic region II are then additionally connected up to one another by corresponding interconnects being formed above the transistors and being contact-connected to the transistors, then a circuit in a dual work function construction is produced in the logic region II.

In the memory region, where the first gate structures 15 are disposed in pairs at a short distance from one another and transistor pairs are produced from transistors 50 with a common source/drain electrode 49, the common electrode 51 is contact-connected by a contact hole filling 54. The contact hole filling 54 extends to the sidewall coverings or spacers 52 of the gate structures 15 of both transistors 50 of the transistor pair.

As a result, a spatially dense configuration of the memory cells 60 in a borderless contact construction is produced in the memory region I, so that, for a predetermined substrate area, it is possible to accommodate more storage capacitors 55 or memory cells 60.

The production of transistors 50 and 30 and 40 with gate electrodes with different layer sequences in the memory region I and in the logic region II becomes possible through the formation of an etching stop layer 17, as a result of which the second gate layer sequence 20 can be patterned without the first gate layer sequence 10 being damaged.

In an alternative type of embodiment, the topmost layer 13 of the first layer sequence 10 can be deposited as first etching stop layer as early as in step a). In this case, the layer 13 deposited in FIG. 1 is composed, for instance, of a nitride or a metal oxide that is resistant to an etchant for etching the layer 21 of the second layer sequence 20. Furthermore, during the sidewall oxidation, the substrate bottom between the first gate structures is also oxidized, thereby producing an oxide layer 23 as further etching stop layer which protects the substrate bottom during the etching in step e). The method corresponding to this alternative type of embodiment again proceeds in accordance with FIGS. 1 to 11, but the method steps of subsequently depositing an additional layer 17 in FIG. 4 and the removal thereof in FIG. 8 are omitted; in FIGS. 5 to 7 the etching stop layer 17 is not present. During the patterning of the second layer sequence 20 in FIG. 6, the first gate structures 15 in the memory region I are protected toward the top by the etching stop layer 13 which is resistant to the anisotropic etching. At the sidewalls of the first gate structures, where the etching rate is low, the oxide layer 14 on the sidewall of the bottommost gate layer 11 suffices in order to avoid damage to the first gate structures 15.

Semiconductor circuits with different gate layer sequences, generally also gate layer sequences of different heights, are fabricated by the methods according to the invention. In order to avoid steps caused as a result of this during planarization steps, additional first gate structures that are not required in the circuitry can be produced in the second area region. On account of their larger height relative to the second gate structures, they have the effect of reducing the height difference between the first and second area regions during chemical mechanical polishing.

I claim:

1. A method for fabricating an integrated semiconductor circuit, which comprises:
    depositing a first layer sequence onto a semiconductor substrate, the first layer sequence having a bottommost layer composed of an oxidizable material;
    patterning the first layer sequence by anisotropic etching in a first area region of the semiconductor substrate to form first gate structures having sidewalls and top sides, surfaces of the semiconductor substrate lying parallel to the top sides being defined between the gate structures, and removing the first layer sequence in a second area region of the semiconductor substrate;
    oxidizing the bottommost layer of the first layer sequence at the sidewalls of the first gate structures in the first area region;
    covering, in the first area region, at least the top sides of the first gate structures and the surfaces of the semiconductor substrate with an etch stop layer;
    covering the first gate structures of the first area region by depositing a second layer sequence onto the semiconductor substrate;
    patterning the second layer sequence by anisotropic etching of the second layer sequence to form second gate structures in the second area region and removing the second layer sequence from the first gate structures in the first area region, and stopping the removing of the second layer sequence in the first area region with the etch stop layer.

2. The method according to claim 1, which further comprises:
    in the depositing step, depositing a first etch stop layer covering the top sides of the first gate structures as topmost layer of the first layer sequence; and
    in the oxidizing step, producing an oxide layer as a further etch stop layer on the surfaces of the semiconductor substrate.

3. The method according to claim 1, which further comprises, between the oxidizing step and the covering step, depositing an additional layer as an etch stop layer onto the first area region.

4. The method according to claim 1, which further comprises using a nitride as the etch stop layer.

5. The method according to claim 4, which further comprises using a silicon nitride as the etching layer.

6. The method according to claim 1, which further comprises using a metal oxide as the etch stop layer.

7. The method according to claim 6, which further comprises using tungsten oxide as the etch stop layer.

8. The method according to claim 1, which further comprises:
    in the covering step, including a bottommost layer in the second layer sequence composed of an oxidizable material; and
    oxidizing the bottommost layer of the second layer sequence at sidewalls of the second gate structures in the second area region.

9. The method according to claim 8, which further comprises removing the etch stop layer by an etching that etches the etch stop layer selectively with respect to the oxidized material of the bottommost layer of the first layer sequence on the sidewalls of the first gate structures and with respect to the oxidized material of the bottommost layer of the second layer sequence on the sidewalls of the second gate structures.

10. The method according to claim 1, which further comprises implanting an n-type doping into the second gate structures in a first partial region of the second area region.

11. The method according to claim 1, which further comprises implanting a p-type doping into the second gate structures in a second partial region of the second area region.

12. The method according to claim 1, which further comprises, in the depositing step, depositing a doped material as the bottommost layer of the first layer sequence.

13. The method according to claim 12, using an n-doped material as the doped material.

14. The method according to claims 1, which further comprises depositing polysilicon as the bottommost layer of both the first and the second layer sequence.

15. The method according to claim 1, which further comprises fabricating selection transistors for memory cells in the first area region.

16. The method according to claim 15, which further comprises producing the selection transistors in transistor pairs with a source/drain electrode implantation common to both transistors in the first area region.

17. The method according to claim 16, which further comprises:
    providing a contact hole filling extending to sidewall coverings of the gate structures of both of the transistors of at least one of the transistor pairs; and
    contact-connecting the common source/drain electrode implantation is contact-connected by the contact hole filling.

18. The method according to claims 2, which further comprises, in the depositing step, depositing the first layer sequence onto the semiconductor substrate covered with the gate oxide layer.

* * * * *